United States Patent [19]

Friedt et al.

[11] Patent Number: 5,279,867
[45] Date of Patent: Jan. 18, 1994

[54] PROCESS FOR PRODUCING A DEPOSIT OF AN INORGANIC AND AMORPHOUS PROTECTIVE COATING ON AN ORGANIC POLYMER SUBSTRATE

[75] Inventors: Jean-Marie Friedt, Tokyo; Pierre Claverie, Tsuchiura, both of Japan; Jéôme Perrin, Paris, France

[73] Assignee: L'Air Liquide Societe Anonyme Pour L'Etude et L'Exploitation des Procedes Georges Claude, Paris, France

[21] Appl. No.: 912,653

[22] Filed: Jul. 9, 1992

Related U.S. Application Data

[63] Continuation of Ser. No. 582,768, Sep. 14, 1990, abandoned.

[51] Int. Cl.$^5$ ............... B05D 3/06; C23C 16/00
[52] U.S. Cl. ............... 427/583; 427/584; 427/582; 427/581; 427/255.3; 427/255.2
[58] Field of Search ............... 427/581, 582, 583, 584, 427/255.1, 255.2, 255.3

[56] References Cited

U.S. PATENT DOCUMENTS

| | | | |
|---|---|---|---|
| 4,181,751 | 1/1980 | Hall et al. | 427/53.1 |
| 4,371,587 | 2/1983 | Peters | 427/53.1 |
| 4,543,271 | 9/1985 | Peters | 427/53.1 |
| 4,545,646 | 10/1985 | Chern et al. | 427/53.1 |
| 4,615,294 | 10/1986 | Scapple et al. | 118/50.1 |
| 4,652,463 | 3/1987 | Peters | 427/54.1 |
| 4,654,226 | 3/1987 | Jackson et al. | |
| 4,859,492 | 8/1989 | Rogers, Jr. et al. | 427/255.3 |
| 4,980,198 | 12/1990 | Dowben et al. | 427/584 |

FOREIGN PATENT DOCUMENTS

| | | | |
|---|---|---|---|
| 9215731 | 12/1984 | Japan | 427/583 |
| 0005510 | 1/1985 | Japan | 427/583 |
| 0130126 | 7/1985 | Japan | 427/583 |
| 0216549 | 10/1985 | Japan | 427/583 |

OTHER PUBLICATIONS

4EME Collogue International Sur Les Plasmas et la Pulverisation Cathodique, Nice, Sep. 13-17, 1982, pp. 95-98, Societe Francaise du Vide; B. Drevillon et al.: "Application de l'ellipsometrie spectroscopique rapide a l'etude de la formation de couches minces de silicium amorphe".

Japanese Journal of Applied Physics, vol. 24, No. 3, partie 1, Mar. 1985, pp. 274-278, Tokyo, JP; J. Takahashi et al.: "UV irradiation effects on chemical vapor deposition of SiO2". Figure 1, p. 274, right column, lines 11-15.

*Primary Examiner*—Marianne Padgett
*Attorney, Agent, or Firm*—Oblon, Spivak, McClelland, Maier & Neustadt

[57] ABSTRACT

A process for producing a deposit of an inorganic and amorphous protective coating on an organic polymer substrate, the coating comprising compounds in the form of an oxide, nitride, carbide, or alloys thereof, by photosensitized decomposition in the gas phase, which comprises decomposing a gas medium by photosensitized decomposition, including precursors of the elements constituting the deposit of the inorganic and amorphous protective coating to be produced by photonic excitation of an impurity which has been previously introduced into the medium, said decomposition being adapted for producing an indirect transfer of energy to the molecules of the medium, thereby causing the decomposition and subsequent deposition of the these elements onto the substrate.

8 Claims, 1 Drawing Sheet

PROCESS FOR PRODUCING A DEPOSIT OF AN INORGANIC AND AMORPHOUS PROTECTIVE COATING ON AN ORGANIC POLYMER SUBSTRATE

This application is a continuation of application Ser. No. 07/582,768, filed on Sept. 14, 1990, now abandoned.

BACKGROUND OF THE INVENTION

1. Field of the Invention

The present invention relates to a process for producing a deposit of an inorganic and amorphous protective coating on an organic polymer substrate.

2. Description of the Background

It is known that organic polymer materials, in particular materials such as polycarbonates, require for some practical high-scale utilizations, a significant improvement of their mechanical surface properties. As an example, in the automobile industry, polycarbonates are advantageously used to replace glass, for example, in the optics of headlights, since these materials are lighter and are, overall, better adapted for producing the complex, elongated or rounded shapes of automobile accessories. However, these polycarbonates have a relatively poor surface resistance which rapidly leads to notable and apparent deterioration, which is highly undesirable.

It, therefore, is necessary to provide on the polycarbonate used, a deposit of a surface coating which is both transparent and stable under ambient temperatures and also resistant to abrasion, shock, wear, and other chemical or mechanical acts that may take place, and in particular, to the effects of humidity or corrosion, or the actions of detergents, for example.

Thin layer deposits on such substrates of polymeric materials, and in particular, these based on polycarbonates of the type mentioned above, are especially adapted to be used with silicon based compounds, such as oxides, nitrides, carbides, or alloys thereof, such as oxynitrides. Indeed, these coatings have optical and mechanical properties which are quite suited to the requirements of proposed applications, combined with an appreciable mechanical resistance. However, a difficulty remains in obtaining, during the application of the deposit constituting the coating on the substrate, a suitable adhesion with the latter, this deposit additionally having to be stable in the presence of thermal shocks which may occur under conditions of ambient environment, and the coating having to be continuous and non-porous. Indeed, because of the low thermal stability of the organic polymer substrate, the deposit of the coating must generally be produced at a low temperature, lower than 150° C. for polycarbonates, above which the surface of the substrate is degraded by glass transition of the polymer constituting the substrate. Under these conditions, conventional techniques for forming thin deposits on a support, for example, by the action of an ionized gas flux or a plasma of an appropriate inorganic and amorphous compound, which require temperatures much higher than 200° C., are not suitable.

The same is true for conventional processes which consist in producing a deposit by means of a silicon type liquid resin, which is deposited by soaking the substrate in a bath, followed by polymerization of the deposit in situ under hot conditions, quite apart from the fact that the thus obtained coating does not have the mechanical and optical properties of one which is produced from silicon compounds.

Applicant's own French patent application No. 87 05669 of Apr. 22, 1987 illustrates that it is conventional to provide a process for the protection of a polymer substrate by means of a coating based on compounds, for example, of the silicon oxynitride type, and more generally, of compounds of silicon and oxygen and/or nitrogen and/or hydrogen, which process consists of exposing the surface of the substrate to gas precursors of these elements in the presence of a plasma of an auxiliary gas, but at a temperature lower than that of the glass transition of the substrate, the process taking place in a reactor where the pressure is very low (0.5 to 10 torr) and in which the gases containing the necessary elements are capable of freeing the elements in the body of the plasma so that they can thereafter be recombined together directly on the substrate to form the desired inorganic deposit. Thus, it is especially proposed in this application to use monosilane ($SiH_4$) or polysilanes ($Si_nH_{2n+2}$), or halosilanes of the formula ($SiX_nH_{4-n}$), to constitute the silicon precursors, the precursors of oxygen and/or nitrogen being selected from among $O_2$, $N_2O$, $N_2$, or $NH_3$.

To operate such a process, it is suitable to use conventional means, particularly to produce the plasma and to confine the latter as well as to regulate the flows of the various gas fluxes required. However, such a process still requires the use of a plasma to afford the thin deposit.

SUMMARY OF THE INVENTION

Accordingly, it is an object of the present invention to provide a process which affords a thin deposit without relying upon a plasma.

It is also an object of the present invention to provide a reactor for the operation of the present process.

The above objects and others which will become apparent in view of the following disclosure are provided, in part, by a process for producing a deposit of an inorganic and amorphous protective coating on an organic polymer substrate, the coating containing compounds in the form of an oxide, nitride, carbide or alloys thereof, by photosensitized decomposition in the gas phase, which comprises decomposing a gas medium by photosensitized decomposition, including precursors of the elements constituting the deposit of the inorganic and amorphous protective coating to be produced, by photonic excitation of an impurity which has been previously introduced into the medium, the decomposition being adapted for producing an indirect transfer of energy to molecules of the medium, thereby causing the decomposition and subsequent deposition of the elements onto the substrate.

DETAILED DESCRIPTION OF THE PREFERRED EMBODIMENTS

Figure 1:
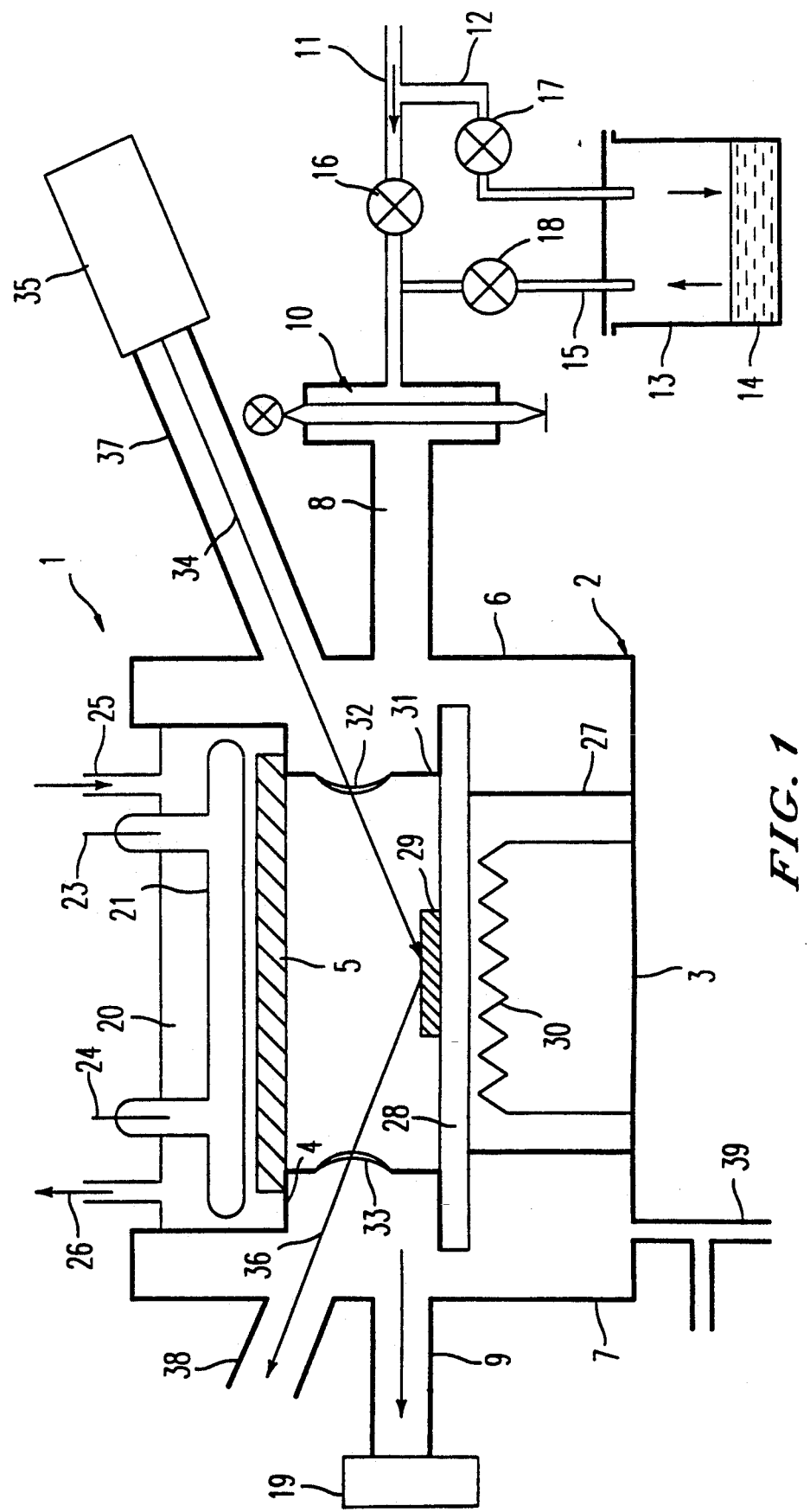
FIG. 1 illustrates a schematic view of the reactor of the present invention in longitudinal cross-section.

The present invention provides a process for producing a deposit of an inorganic and amorphous protective coating on an organic polymer substrate, in particular, a polycarbonate substrate. This coating comprises silicon base compounds in the form of an oxide, nitride, carbide, or alloys thereof, and is obtained by photosensitized decomposition in the vapor phase of these compounds. The invention also provides a reactor adapted to operate this process.

The present invention provides a process which, without having, for example, to rely on a plasma, enables the obtainment, in a simple, efficient, and inexpensive manner, of a thin deposit which exhibits excellent adhesion to a substrate, while having the mechanical and optical properties and resistance to chemical attack which are indispensable for the proposed uses. The present invention also provides, for the thin deposit adhering to the substrate, layers of variable composition of small thickness which prevent difficulties which are prejudicial to the interface between the deposit and the substrate.

For this purpose, present the process entails utilizing the photosensitized decomposition of a gas mixture including the precursors of the element constituting the deposit of the amorphous and inorganic protective coating to be produced, by photon excitation of an impurity previously introduced into the medium, which is capable of producing an indirect transfer of energy to the molecules of the latter, so as to allow for the decomposition followed by the deposit of these elements on the substrate.

According to the process of the invention, the decomposition in the gas phase of the compounds including the precursors of the elements entering into the composition of the protective coating, such as, with respect to silicon, mixtures of silanes, polysilanes, halosilanes, or organosilanes, such as methylsilanes $Si_n(CH_3)_m H_{(2N+2-m)}$ and a gas providing the second element of the deposit, such as $O_2$, $NO_2$, $N_2O$, $NH_3$, $N_2H_4$, $SiH_3NH_2$, alkanes ($C_nH_{2n+2}$), alkenes ($C_nH_{2n}$) or acetylene ($C_2H_2$), in order to form protective deposits of the formula $SiO_x$, $SiN_y$, $SiC_z$ or their alloys, Si-(O,N,C), is carried out by loading the gas medium with an impurity having an efficient cross section of absorption of optimized light, which is capable of producing the transfer of energy required for this decomposition and of subsequently recombining the elements of the coating on the substrate.

The mechanical impurity introduced into the gas medium depends on the photon radiation of the lamp. Thus, metallic impurities, such as Hg or Cd, for example, in combination with metallic vapor lamps of the same element to benefit from spectral lines of resonating absorption, can be used.

Preferably, but not exclusively, the impurity is mercury, Hg. On the other hand, the gas medium is advantageously loaded with mercury by passage through a reserve of this liquid metal, maintained at a temperature of between 40° and 60° C. The concentration of the atoms of mercury in the medium are very low and comprise between $10^{12}$ and $10^{13}$ atoms per cubic centimer. This concentration is sufficient to produce the transfer of energy originating from the decomposition of the gas medium, while limiting the contamination of the coating by the impurity, to a very reduced value, i.e., lower than 10 ppm.

According to another characteristic of the present process, the gas medium loaded with the impurity, such as mercury, is introduced into a reactor, at a pressure between 0.1 and 100 torr, preferably between 1 and 10 torr, with a flow between 10 and 200 cc/sec, then the thus treated mixture is subjected to photon radiation, such as is produced by a vapor lamp of the same element as the element introduced into the gas medium, which radiation passes through a quartz window to penetrate inside the reactor. Advantageously, the substrate can be previously heated at an appropriate temperature, of the order of 120° C., but, in any case lower than the glass transition temperature of the substrate.

According to a variant of the present process, the molecules are decomposed by the radiation, after absorption by the substrate, the latter being preferably cooled and maintained at a determined negative temperature, which can be as low as −70° C. In all cases, however, the pressure of the gas mixture in the reactor, the geometry of the latter, the distance between the lamp and the substrate, are optimized for each type of mixture, by adopting each time exactly determined reaction parameters.

In accordance with the present invention, the molecules of the precursors of the deposit of the protective coating ($SiH_4$, $O_2$, $NH_3$, $CH_4$...) are then decomposed by the non-radiating energy transfer of the photo-excited atoms of the metallic impurity introduced into the gas medium, while freeing the molecules of Si, O, N or H, which are then recombined on the substrate, to form the required coating.

The characteristics of hardness, transparency, and resistance to abrasion and shocks of the deposit obtained are particularly improved as compared to known coatings, which are generally not very adherent and which exhibit a particularly sensitive thermal instability, by reason, for example, of the differences of linear coefficients of dilatation between the coating and the substrate. In particular, the hardness of the coating obtained is much higher than that of the substrate; thus, for a polycarbonate having a Knoop hardness equal to 32, that of the coating is comparable to that of glass, by being between 430 and 820. Moreover, the deposit has notable properties with respect to its water wettability and its antistatic power and exhibits advantageous optical properties, in particular a high transmission capacity and a low diffusion of light.

According to another characteristic of the present process, the adhesive properties of the coating can be further improved by means of a deposit which is progressively or gradually enriched in nitrogen, nitride or carbon.

In addition, in order to produce a better adhesion with the substrate, it is of interest to prevent the occurrence of strains at the interface between the substrate and the protective deposit produced on the latter. For this purpose and according to another characteristic of the present invention, the coating may be produced with a variable gradient of concentration in a direction perpendicular to the surface of the substrate so that the enrichment in oxygen, nitrogen or carbon is higher towards the outside than at the interface with the substrate.

According to another characteristic of the invention, the speed of deposition of the coating can be increased by bringing the substrate at a temperature lower than 0° C. and even −70° C., the number of atoms adsorbed by the surface of the substrate being substantially increased, typically twice the number of atoms, the speed of deposit being itself increased in the same proportion.

Whatever the mode of operation of the process, the variation of the thickness of the coating is low, below 10%, this thickness being on average equal to or slightly higher than 1 micron. If the surface of the substrate is substantial, in particular larger than 25 cm$^2$, a plurality of adjacent mercury vapor lamps can usefully be used, disposed side by side. As a variant, it is also possible to allow the substrate to travel under a single lamp with constant radiant intensity.

According to a preferred embodiment of the present invention, the substrate is of the polycarbonate, polymethylmethacrylate, polystyrene, crystallized polystyrene, or acrylonitrile type. However, the substrate is preferably a polycarbonate such as poly-(oxycarbonyloxy-1,4-phenylene isopropylidene-1,4-phenylene) or a copolymer of bisphenol A.

The transparent substrates thus coated can be used to constitute headlight screens, visors for motorcycle helmets, careenages, fixed glass of vehicles, and aircraft windows, urban and domestic lighting optics, security windows, screens and protection for apparati and indicator panels, greenhouses, verandas and roofs of plastic material, ordinary or compact discs, glass for watches or spectacles, as non-limiting examples. The invention may, however, also be used in the protection of non-transparent materials, and in numerous industrial or public applications.

The present invention also provides a reactor which is required to operate the process, characterized in that it entails an enclosure, adapted to contain the substrate, provided with an inlet duct for the gas medium including the precursors of the elements constituting the coating, and an evacuation duct provided with a pump for the exhaust of the residues of decomposition, a scrubber provided on the inlet duct, containing a bath formed by the impurity to be introduced into the gas medium, this scrubber being associated with flow regulating valves for this gas medium, and at least one partition which is transparent to, the radiation originating from a source of photons, which delivers a lighting flux of predetermined wave length in the direction of the substrate.

Preferably, the source of photons is a mercury or deuterium vapor lamp, the transparent partition being made of quartz. In addition and according to another characteristic of the present reactor, the lamp is located outside the enclosure in a cavity through which a cooling fluid flows, such as air.

According to a preferred embodiment, the substrate rests on a support which is mounted inside the enclosure and which is associated with a heating resistance or a cryostat which are both adjustable and are capable of modifying on request the temperature of the substrate.

According to yet another characteristic of the reactor under consideration, the enclosure contains openings enabling the passage of the radiation introduced by an apparatus for the direct measurement of the thickness of the coating deposited on the substrate, for example, of the type of a reflectometry or ellipsometry apparatus. On the other hand, the reactor contains means for sampling the gas medium for analysis of the components of the latter, in particular by mass spectrometry in the gas phase. In addition, and according to another advantageous embodiment, the enclosure contains an independent secondary pump assembly to withdraw air when closing the reactor, ensuring gas removal from the partitions of the latter and from the substrate.

In referring now to FIG. 1, the present reactor is generally designated by reference 1. It mainly contains an enclosure 2 containing a bottom partition 3 and an upper partition or ceiling 4, and in an opening thereof is mounted a transparent window 5, preferably of quartz. The enclosure 2 contains ducts 8 and 9, respectively, in these lateral partitions 6 and 7, which communicate with the interior of the enclosure and which are restricted, in the case of duct 8, to admission into the enclosure of the gas medium containing the precursors of the coating to be produced and for duct 9, to the evacuation of the residues obtained after decomposition of this medium.

The intake duct 8 includes a device 10 for measuring the composition of the gas medium at the inlet into the enclosure, the gas medium being delivered from an exterior source, not shown, through a channel 11 on which a bypass 12 is connected so that at least a fraction of the flow of this gas medium passes through a scrubber 13, containing a liquid medium, and in particular, consisting of an impurity to be introduced into this medium. The scrubber 13 thus contains a given volume 14 of a liquid metal, such as mercury, the temperature inside the bath preferably being maintained between about 40° and 60° C.

The fraction thus loaded with the impurity is sent via a return channel 15 towards channel 11 and, from there, towards admission duct 8. Valves, respectively 16, 17, and 18, are mounted on channels 11, 12, and 15 to adjust the relative flows of the gas medium and of the fraction of the latter passing through the scrubber 13. On the opposite side, the evacuation duct 9 includes a suction pump 19, which produces the depression required for the circulation of the gas medium inside the enclosure. Advantageously, the pressure inside the reactor is kept between 0.1 and 10 torr, the flow of gas medium being itself limited between 10 and 200 cc/sec, depending on the nature of the components of this gas medium and consequently the elements constituting the coating to be deposited.

On the other hand, the enclosure 2 includes, mounted above the quartz window 5, inside a cavity 20, a mercury vapor lamp 21, capable of supplying into the enclosure through the window a lighting radiation of determined energy, with a wavelength also exactly predetermined, i.e., between 185 and 254 nm in the case of mercury. The lamp 21 is connected to an appropriate source of voltage by means of electrical connections 23 and 24, creating in the lamp the lighting discharge required for the production of the desired radiation. Thus, the cavity 20 is connected by means of ducts 25 and 26 to a device, not shown, providing permanent circulation of a flow of cooling fluid, such as air, around the lamp.

Inside the enclosure 2 there is mounted a support element 27 for a support plate 28, on which rests the substrate 29 which is intended to receive the desired coating, this substrate being preferably produced from an organic polymer material, and more particularly, polycarbonate. Under the plate 28 there is advantageously mounted a heating resistance or a cryostat which are both adjustable and are generally designated under the reference numeral 30, to adjust the temperature of the substrate before depositing the coating thereon. The maximum temperature is at most equal to 120° C. in order not to exceed the threshold of glass transition of the substrate; the minimum temperature depends, on the other hand, on the adopted speed of deposit and should not be lower than the temperature of the boiling point of the various gases utilized.

The substrate is surrounded by a partition 31 defining a screen, to limit disturbances at the inlet and the outlet of the gas medium penetrating and exiting from the enclosure through ducts 8 and 9, the screen 31 including openings 32 and 33, both for the passage of the gas medium straight above the substrate under window 5, but also to continuously take the measurement of the thickness of the deposit produced on the substrate, for example, by means of the incident radiation 34, which originates from a measurement apparatus 35 of the reflectometer or ellipsometer type, connected to the enclosure 2 by means of a connecting sleeve 37, the reflected radiation 36 being sent through a second sleeve 38 towards a detector (not shown). A connector 39 permits a possible sampling of the gas medium, for example, to afford analysis by means of a mass spectrograph.

The operation of the process according to the present invention is carried out inside the enclosure of the reactor briefly described above, according to the process already described, by producing a decomposition in the gas phase at low temperature of the gas medium in which an impurity has previously been incorporated, in the present case mercury, by photon energy input originating from the lighting lamp associated with the enclosure. This decomposition of the gaseous molecules, resulting from the excitation of the atoms of the impurity thus introduced which presents an efficient section of optimized absorption of the radiation delivered, permits the precursors of the deposit, and in particular, silicon, oxygen, carbon or nitrogen, to be recombined on the surface of the substrate, by then directly forming on the latter the desired deposit.

The present invention will now be further illustrated by reference to certain Examples which are provided solely for the purpose of illustration and which are not intended to be limitative.

EXAMPLES 1-5

The experimental process used is in all cases identical and corresponds to the following operations:

1) the sample is placed on the substrate carrier;

2) the enclosure of the reactor is closed and the air that it contains is withdrawn to reach a secondary vacuum, with a residual pressure of $10^{-6}$ and $10^{-7}$ torr;

3) heating or cooling of the substrate carrier is initiated until reaching the desired equilibrium temperature;

4) the container of metallic impurities, for example, Hg, is raised at a temperature between about 40° and 60° C.;

5) the system of a secondary pump is isolated after the introduction of the reactive gases in the enclosure of the reactor, to prevent a raising of the oil of the pump system;

6) the flows and the total pressure of the gases are stabilized to desired values, the adjustment of the pressure is carried out by means of a reducing valve or a diaphragm located between the pump and the enclosure;

7) the mercury vapor lamp is placed under voltage and lighted to stabilization of its working temperature and of the light flux that it delivers. During this preliminary phase, a movable screen isolates the lamp from the quartz window of the reactor;

8) the formation of the deposit starts once the screen has been removed, when the gas medium is subject to the irradiation of the lamp; and 9) the growth of the deposit is interrupted by shutting out the lamp and stopping the flow of gases.

In all the cases indicated hereinafter, a low pressure mercury vapor lamp is used, which delivers radiation between 10 and 20 mw/cm² at 254 nm.

|  | Deposit Formed | Gas Used | Ratio of Gases | Speed of Deposit |
|---|---|---|---|---|
| Example 1 | $SiN_x$ | $Si_2H_6:NH_3$ $N_2$ | 1:50:50 | 4 nm/mn |
| Example 2 | $SiO_2$ | $SiH_4:N_2O$ | 1:50-200 | 20 nm/mn |
| Example 3 | $SiN_x$ | $SiH_4:NH_3$ | 2:1-150 | 17 nm/mn |
| Example 4 | $SiC_x$ | $SiH_4:C_2H_2$ or $Si_2H_6$ | 50:50 | 6 nm/mn |
| Example 5 | $SiC_x$ | $Si(CH_3)_2H_2$ | 100 | 2 nm/mn |

Having described the present invention, it will be apparent to one skilled in the art that many changes and modification may be made to the above-described embodiments without departing from the spirit and scope of the present invention.

What is claimed as new and desired to be secured by Letters Patent of the United States is:

1. A process for producing a deposit of an inorganic and amorphous protective coating on an organic polymer substrate, the coating comprising inorganic and amorphous oxide, nitride or carbide compounds or alloys thereof, which process comprises subjecting a gas medium to radiation, the gas medium comprising precursors of the compounds or alloys constituting the protective coating to be produced, thereby causing subsequent decomposition of the compounds or alloys thereof, and wherein the substrate is previously cooled to a temperature lower than about 0° C. to increase the rate of decomposition of the compounds or alloys thereof on the substrate.

2. The process according to claim 1, wherein the gas medium is prepared from a mixture of $SiH_4$, $Si_2H_6$, polysilanes, halosilanes, or organosilanes; and $O_2$, $NO_2$, $N_2O$, $NH_3$, $N_2H_4$, $SiH_3NH_2$, alkanes, alkenes, or acetylene, for producing the protective deposit of the silicon oxides, nitrides, carbides, or alloys thereof.

3. The process according to claim 1, which further comprises improving the adhesiveness of the deposit on a substrate by loading the gas medium with nitrogen or carbon or by providing in the coating a concentration gradient which varies according to a direction which is perpendicular to the surface of the substrate so that the exterior is more enriched in nitrogen, oxygen or carbon than the interior of the substrate.

4. The process according to claim 1, wherein the coating has a hardness which is higher than that of the substrate.

5. The process according to claim 1, wherein the coating has a thickness on average of about 1 $\mu$, with a thickness variation of less than 10%.

6. The process according to claim 1, wherein the substrate is selected from the group consisting of polycarbonate, polymethyl methacrylate, polystyrene, crystallized polystyrene and acryonitrile.

7. The process according to claim 6, wherein said polycarbonate is poly-(oxycarbonyloxy-1, 4-phenylene isopropylidene-1, 4-phenylene) or a copolymer of bisphenol A.

8. The process according to claim 1, wherein said substrate is previously cooled to a temperature of as low as $-70°$ C.

* * * * *

UNITED STATES PATENT AND TRADEMARK OFFICE
CERTIFICATE OF CORRECTION

PATENT NO.   :   5,279,867
DATED        :   January 18, 1994
INVENTOR(S)  :   Jean-Marie Friedt, et al.

It is certified that error appears in the above-indentified patent and that said Letters Patent is hereby corrected as shown below:

On the title page, Item [30] has been omitted and Item [75] should read as follows:

[30] The Foreign Application Priority Data should read:
--Sep. 14, 1989 [FR] France......89 12063--

[75] The inventorship should read:
--Jean-Marie Friedt, Tokyo, Japan; Pierre Claverie, Boulogne-Billancourt; Jérôme Perrin, Paris, both of France--

Signed and Sealed this

Fifth Day of July, 1994

Attest:

BRUCE LEHMAN

*Attesting Officer*   *Commissioner of Patents and Trademarks*